United States Patent
Tran

(10) Patent No.: US 8,994,189 B2
(45) Date of Patent: *Mar. 31, 2015

(54) SEMICONDUCTOR STRUCTURES INCLUDING TIGHT PITCH CONTACTS

(71) Applicant: Micron Technology, Inc., Boise, ID (US)

(72) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/275,414

(22) Filed: May 12, 2014

(65) Prior Publication Data

US 2014/0246784 A1 Sep. 4, 2014

Related U.S. Application Data

(60) Continuation of application No. 13/194,558, filed on Jul. 29, 2011, now Pat. No. 8,723,326, which is a division of application No. 11/833,386, filed on Aug. 3, 2007, now Pat. No. 8,481,417.

(51) Int. Cl.
*H01L 23/48* (2006.01)
*H01L 21/02* (2006.01)
(Continued)

(52) U.S. Cl.
CPC ........ *H01L 23/481* (2013.01); *H01L 21/02164* (2013.01); *H01L 21/0228* (2013.01); *H01L 21/0337* (2013.01); *H01L 21/0338* (2013.01); *H01L 21/31144* (2013.01);
(Continued)

(58) Field of Classification Search
CPC .................. H01L 2924/00; H01L 2924/0014; H01L 2224/73265; H01L 2224/73215; H01L 21/0338; H01L 23/481
USPC .................. 257/774–775, 295–326, E21.476
See application file for complete search history.

(56) References Cited

U.S. PATENT DOCUMENTS 5,328,810 A 7/1994 Lowrey et al.
6,225,207 B1 5/2001 Parikh
(Continued)

FOREIGN PATENT DOCUMENTS

JP 10256369 A 9/1998
JP 2003078035 A 3/2003
(Continued)

OTHER PUBLICATIONS

Chinese Office Action dated Apr. 16, 2012, for Chinese Application No. 200880101654.6, 13 pages.
(Continued)

*Primary Examiner* — Cuong Q Nguyen
(74) *Attorney, Agent, or Firm* — TraskBritt

(57) ABSTRACT

Methods of fabricating semiconductor structures incorporating tight pitch contacts aligned with active area features and of simultaneously fabricating self-aligned tight pitch contacts and conductive lines using various techniques for defining patterns having sublithographic dimensions. Semiconductor structures having tight pitch contacts aligned with active area features and, optionally, aligned conductive lines are also disclosed, as are semiconductor structures with tight pitch contact holes and aligned trenches for conductive lines.

20 Claims, 8 Drawing Sheets

(51) Int. Cl.
*H01L 21/033* (2006.01)
*H01L 21/311* (2006.01)
*H01L 21/314* (2006.01)
*H01L 21/316* (2006.01)
*H01L 21/768* (2006.01)

(52) U.S. Cl.
CPC ..... *H01L 21/3141* (2013.01); *H01L 21/31608* (2013.01); *H01L 21/7681* (2013.01); *H01L 21/76816* (2013.01); *H01L 2924/0002* (2013.01)
USPC .......................... 257/774; 257/775; 257/306

(56) References Cited

U.S. PATENT DOCUMENTS

| | | | |
|---|---|---|---|
| 6,573,030 | B1 | 6/2003 | Fairbairn et al. |
| 6,740,584 | B2 | 5/2004 | Eimori |
| 6,911,389 | B2 | 6/2005 | Brennan et al. |
| 7,084,076 | B2 | 8/2006 | Park et al. |
| 7,105,431 | B2 | 9/2006 | Yin |
| 7,115,525 | B2 | 10/2006 | Abatchev et al. |
| 7,135,401 | B2 | 11/2006 | Tran et al. |
| 7,205,227 | B2 | 4/2007 | Tran et al. |
| 7,268,054 | B2 | 9/2007 | Tran et al. |
| 7,361,569 | B2 | 4/2008 | Tran et al. |
| 7,368,362 | B2 | 5/2008 | Tran et al. |
| 7,629,693 | B2 | 12/2009 | Abatchev et al. |
| 7,648,919 | B2 | 1/2010 | Tran et al. |
| 7,651,951 | B2 | 1/2010 | Tran et al. |
| 7,687,408 | B2 | 3/2010 | Abatchev et al. |
| 7,759,197 | B2 | 7/2010 | Tran |
| 7,776,683 | B2 | 8/2010 | Tran et al. |
| 7,790,531 | B2 | 9/2010 | Tran |
| 7,808,053 | B2 | 10/2010 | Haller et al. |
| 7,829,262 | B2 | 11/2010 | Tran |
| 7,960,797 | B2 | 6/2011 | Lee |
| 8,481,417 | B2 | 7/2013 | Tran |
| 8,723,326 | B2 * | 5/2014 | Tran .............................. 257/774 |
| 2002/0052112 | A1 | 5/2002 | Lee et al. |
| 2004/0053501 | A1 | 3/2004 | Brennan |
| 2004/0180557 | A1 | 9/2004 | Park et al. |
| 2005/0064197 | A1 | 3/2005 | Nishii et al. |
| 2006/0046484 | A1 | 3/2006 | Abatchev et al. |
| 2006/0216922 | A1 | 9/2006 | Tran et al. |
| 2006/0258162 | A1 | 11/2006 | Abatchev et al. |
| 2006/0263699 | A1 | 11/2006 | Abatchev et al. |
| 2006/0264001 | A1 | 11/2006 | Tran et al. |
| 2006/0292801 | A1 | 12/2006 | Chung |
| 2007/0049035 | A1 | 3/2007 | Tran |
| 2007/0161251 | A1 | 7/2007 | Tran et al. |
| 2007/0241378 | A1 | 10/2007 | Aritome |
| 2008/0054483 | A1 | 3/2008 | Lee et al. |
| 2009/0035584 | A1 | 2/2009 | Tran et al. |
| 2009/0035665 | A1 | 2/2009 | Tran |
| 2011/0285029 | A1 | 11/2011 | Tran |

FOREIGN PATENT DOCUMENTS

| | | |
|---|---|---|
| JP | 2004111973 A | 4/2004 |
| KR | 1020020018119 A | 3/2002 |
| KR | 1020050086301 A | 8/2005 |
| KR | 1020120081253 A | 7/2012 |

OTHER PUBLICATIONS

Chinese Office Action dated May 5, 2011, for Chinese Application No. 200880101654.6, 11 pages.
International Preliminary Report on Patentability for International Application No. PCT/US2008/071031, dated Feb. 9, 2010, 6 pages.
International Search Report for International Application No. PCT/US2008/071031 dated Feb. 25, 2009, 4 pages.
International Written Opinion for International Application No. PCT/US2008/071031 dated Feb. 25, 2009, 5 pages.
Japanese Office Action dated Jan. 22, 2013, for Japanese Application No. 2010-520078, 6 pages.
Japanese Office Action dated May 21, 2013, for Japanese Application No. 2010-520078, 4 pages.
Japanese Office Action dated Sep. 18, 2012, for Japanese Application No. 2010-520078, 6 pages.
Korean Office Action dated Apr. 9, 2012, for Korean Application No. 10-2010-7004071, 3 pages.
Korean Office Action dated Aug. 29, 2012, for Korean Application No. 10-2010-7004071, 3 pages.
Korean Office Action dated Jun. 28, 2013, for Korean Application No. 10-2010-7004071, 4 pages.
Korean Office Action dated Jun. 30, 2011, for Korean Application No. 10-2010-7004071, 4 pages.
Taiwanese Office Action dated Jan. 21, 2013, for ROC (Taiwan) Application No. 097129387, 7 pages.
Taiwanese Office Action dated Jan. 5, 2012, for ROC (Taiwan) Application No. 097129387, 10 pages.

* cited by examiner

SEMICONDUCTOR STRUCTURES INCLUDING TIGHT PITCH CONTACTS

CROSS-REFERENCE TO RELATED APPLICATIONS

This application is a continuation of U.S. patent application Ser. No. 13/194,558, filed Jul. 29, 2011, now U.S. Pat. No. 8,723,326, issued May 13, 2014, which is a divisional of U.S. patent application Ser. No. 11/833,386, filed Aug. 3, 2007, now U.S. Pat. No. 8,481,417, issued Jul. 9, 2013, the disclosure of each of which is hereby incorporated herein in its entirety by this reference.

TECHNICAL FIELD

Embodiments of the invention relate generally to integrated circuit fabrication techniques. More specifically, embodiments of the invention relate to fabrication of semiconductor structures incorporating reduced, or "tight," pitch contacts in alignment with active area features and, optionally, associated conductive lines thereover.

BACKGROUND

As a consequence of many factors, including demand for increased portability, computing power, memory capacity and energy efficiency in modern electronics, integrated circuits as fabricated on semiconductor substrates are continuously being reduced in size. To facilitate this size reduction, research continues into ways of reducing the sizes of integrated circuits' constituent elements. Non-limiting examples of those constituent elements include transistors, capacitors, electrical contacts, lines, and other electronic component elements. The trend of decreasing feature size is evident, for example, in memory circuits incorporated in devices such as dynamic random access memories (DRAMs), static random access memories (SRAMs), ferroelectric (FE) memories, electronically-erasable programmable read-only memories (EEPROMs), Flash memories, etc.

A NAND Flash memory chip, for example, conventionally comprises billions of identical circuit elements, known as memory cells, arranged in a plurality of arrays with associated logic circuitry. Each memory cell traditionally stores one bit of information, although multi-level cell devices can store more than one bit per cell. Each such memory cell comprises an addressable location that can store one bit (binary digit) of data. A bit can be written to a cell and read to retrieve the stored information. By decreasing the sizes of constituent elements, the conducting lines that connect them, and the conductive contacts carrying charge between them, the sizes of the elements incorporating these features can be decreased. Storage capacities and circuit speed can be increased by fitting more memory cells into a given area on the active surface of the memory device.

The continual reduction in sizes of features from which the foregoing elements are fabricated places ever-greater demands on techniques used to form the features. For example, photolithography is commonly used to pattern features on a substrate. The concept of "pitch" can be used to describe the sizing of these features. Pitch is the distance between identical points in two adjacent repetitive features. The spaces between adjacent features may be filled by another material, such as a dielectric. As a result, pitch can be viewed as the sum of the width of a feature and of the width of the space separating that feature from a neighboring feature, when that neighboring feature is part of a repeating or periodic pattern, such as may occur, for example, in an array of features.

Photoresist materials may be conventionally formulated to respond only to selected wavelengths of light. One common range of wavelengths that can be used lies in the ultraviolet (UV) range. Because many photoresist materials respond selectively to particular wavelengths, photolithography techniques each have a minimum pitch dictated by the wavelength, below which that particular photolithographic technique cannot reliably form features. Thus, the minimum pitch achievable using a particular photoresist can limit the capability for feature size reduction.

Pitch reduction techniques, often somewhat erroneously termed "pitch multiplication" as exemplified by "pitch doubling," etc., can extend the capabilities of photolithography beyond the feature size limitations dictated by photoresists to allow creation of smaller, more densely arranged features. That is, conventional "multiplication" of pitch by a certain factor actually involves reducing the pitch by that factor. In fact, "pitch multiplication" increases the density of features by reducing pitch. Pitch thus has at least two meanings: the linear spacing between identical features in a repeating pattern; and the density or number of features per given or constant linear distance. This conventional terminology is retained herein.

Examples of such methods are described in U.S. Pat. No. 5,328,810, issued to Lowrey et al., and Patent Application Publication No. 2007/0049035, to Luan C. Tran, the entire disclosure of each of which document is incorporated herein by reference.

The critical dimension (CD) of a mask scheme or corresponding circuit element to be implemented on a given semiconductor material-based integrated circuit at a particular level is the scheme's minimum feature dimension, or the measurement of the smallest width of the smallest feature that exists in that scheme or element. Due to factors such as geometric complexity and different requirements for critical dimensions in different parts of an integrated circuit, not all features of the integrated circuit may be pitch multiplied. Furthermore, conventional pitch multiplication entails additional steps relative to conventional lithography, which can involve considerable additional time and expense. However, if some features of an integrated circuit are pitch multiplied, it is inconvenient if connecting features that interface with those features are not also pitch multiplied. Thus, superimposed features that are configured to contact each other are advantageously of similar dimensions. Such similar dimensions can enable smaller and more efficient operative components on an integrated circuit, thus increasing feature density and decreasing chip size.

Conventional methods of forming contacts through insulating materials to create electrical connections between circuit layers at different levels have not allowed the density of contacts to match the density of the features intended to be connected thereby. Accordingly, there is a need for methods of forming contacts with reduced dimensions and pitch that can match the density of the features intended to be connected by those contact features, especially where pitch multiplication is used to form the features to be connected.

Furthermore and as noted above, there is a need for a reduction in the size of integrated circuits and an increased operable density of the arrays of electrical elements on computer chips. Accordingly, a need exists for improved methods of forming features with reduced critical dimensions relative to conventional methods; improved methods for increasing feature density; methods that will produce more efficient arrays; methods that will provide more compact arrays without harming feature resolution; and methods that simplify or eliminate acts in the creation of reduced-size features.

BRIEF DESCRIPTION OF THE SEVERAL
VIEWS OF THE DRAWINGS

In the drawings, which depict various embodiments of the present invention:

DETAILED DESCRIPTION

Figure 1A:
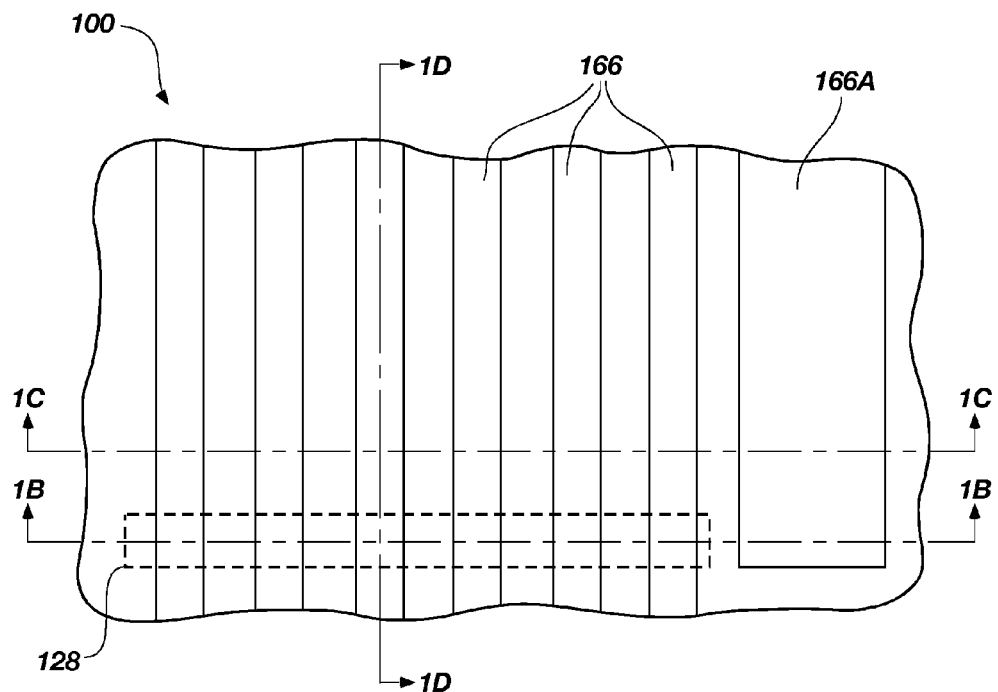
FIGS. 1A-1D are partial views of an embodiment of a semiconductor device of the present invention.

Embodiments of the present invention include semiconductor structures in which tight, or pitch-multiplied contacts are formed in alignment with underlying features of an active area of a semiconductor structure. In an embodiment, a tight pitch contact and aligned conductive line are concurrently formed. As used herein, the term "tight" pitch refers to a pitch and attendant feature size smaller than that which can be achieved using conventional lithographic techniques absent pitch multiplication. Stated another way, a tight pitch may be characterized as a sublithographic resolution pitch.

Embodiments of the present invention may include any of the processes or structures described in U.S. patent application Ser. No. 11/215,982, the entire disclosure of which is incorporated herein by reference, and described in United States Patent Application Publication No. 2007/0049035, to Luan C. Tran, now U.S. Pat. No. 7,829,262, issued Nov. 9, 2010, the entire disclosure of which was previously incorporated herein by reference.

Details of non-limiting embodiments of the present invention are described hereinafter, with reference to the drawings.

As will be apparent to one of ordinary skill in the art, the various layers discussed herein with respect to fabrication of a semiconductor structure may be formed by methods known to those of skill in the art and suitable for use with the material of a given layer. Examples include, but are not limited to, spin-on techniques, spray-on techniques, chemical vapor deposition (CVD), atomic layer deposition (ALD), physical vapor deposition (PVD), also termed "sputtering," and related selective processes, such as selective CVD. By way of further non-limiting example, various vapor deposition processes, such as chemical vapor deposition, may be used to form hard mask layers. A low temperature chemical vapor deposition process may be used to deposit the hard mask layers or any other materials, e.g., spacer material, over a mask layer, where the mask layer is typically formed of amorphous carbon. Such low temperature deposition processes advantageously prevent chemical or physical disruption of the amorphous carbon layer. Amorphous carbon layers may be formed by chemical vapor deposition using a hydrocarbon compound, or mixtures of such compounds, as carbon precursors. Examples of suitable precursors include propylene, propyne, propane, butane, butylene, butadiene and acetylene. A suitable method for forming amorphous carbon layers is described in U.S. Pat. No. 6,573,030 B1, issued to Fairbairn et al., on Jun. 3, 2003, the entire disclosure of which is incorporated herein by reference. In addition, the amorphous carbon may be doped. A suitable method for forming doped amorphous carbon is described in U.S. patent application Ser. No. 10/652,174 to Yin et al., now U.S. Pat. No. 7,105,431, issued Sep. 12, 2006, the entire disclosure of which is incorporated herein by reference and made part of this specification. Spin-on-coating processes may be used to form photodefinable layers, such as resist layers.

In addition to selecting appropriate materials for the various layers, the thicknesses of the layers may be chosen for compatibility with etch chemistries and process conditions to be employed. By way of non-limiting example, when transferring a pattern from an overlying layer to an underlying layer by selectively etching the underlying layer, materials from both layers are removed to some degree, even when a selective etch chemistry is employed. Thus, the upper layer is preferably thick enough so that it is not removed over the course of the pattern transfer. Hard mask layers may be advantageously thin so that their transfer or removal can be short, exposing surrounding materials to less degradation.

Figure 1B:
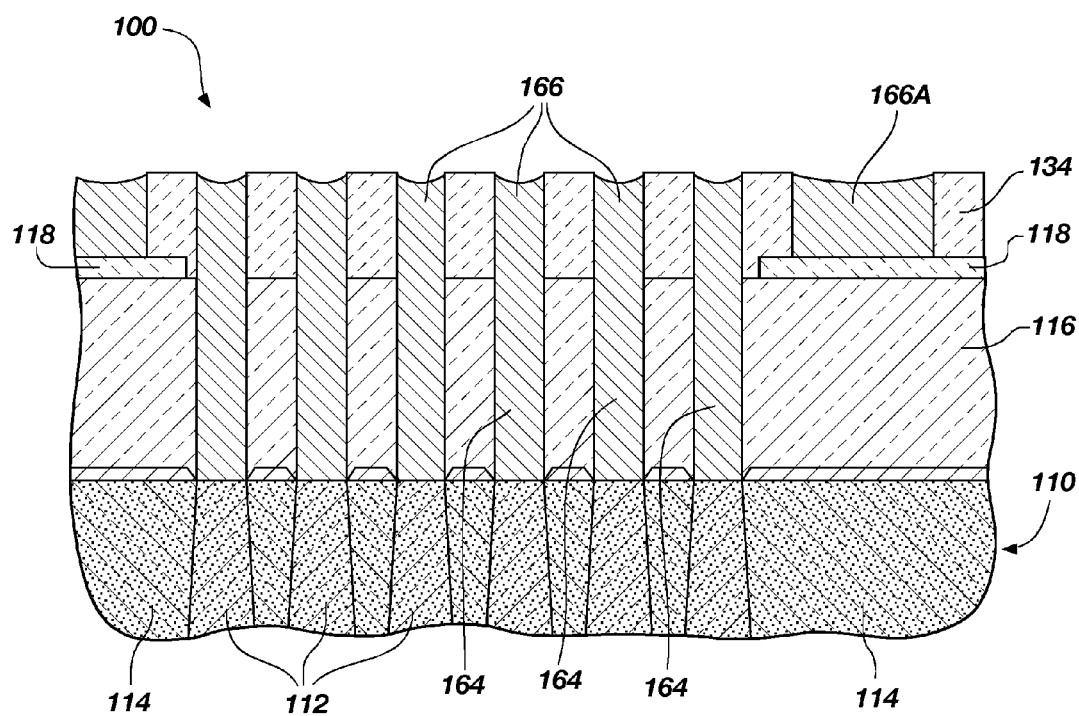
Figure 1C:
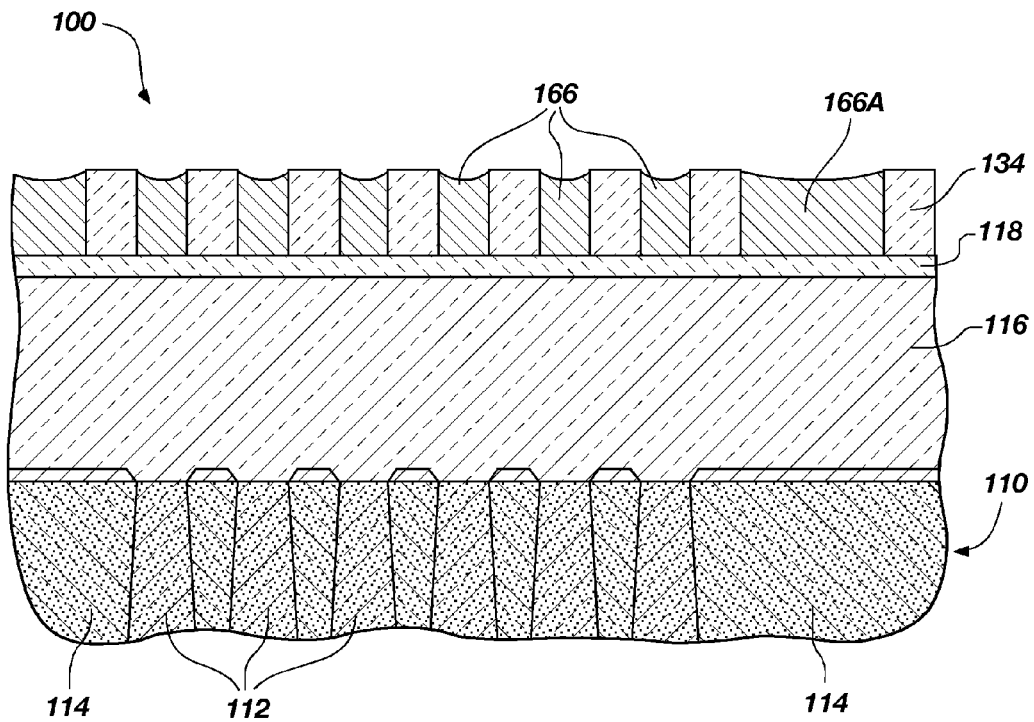
Figure 1D:
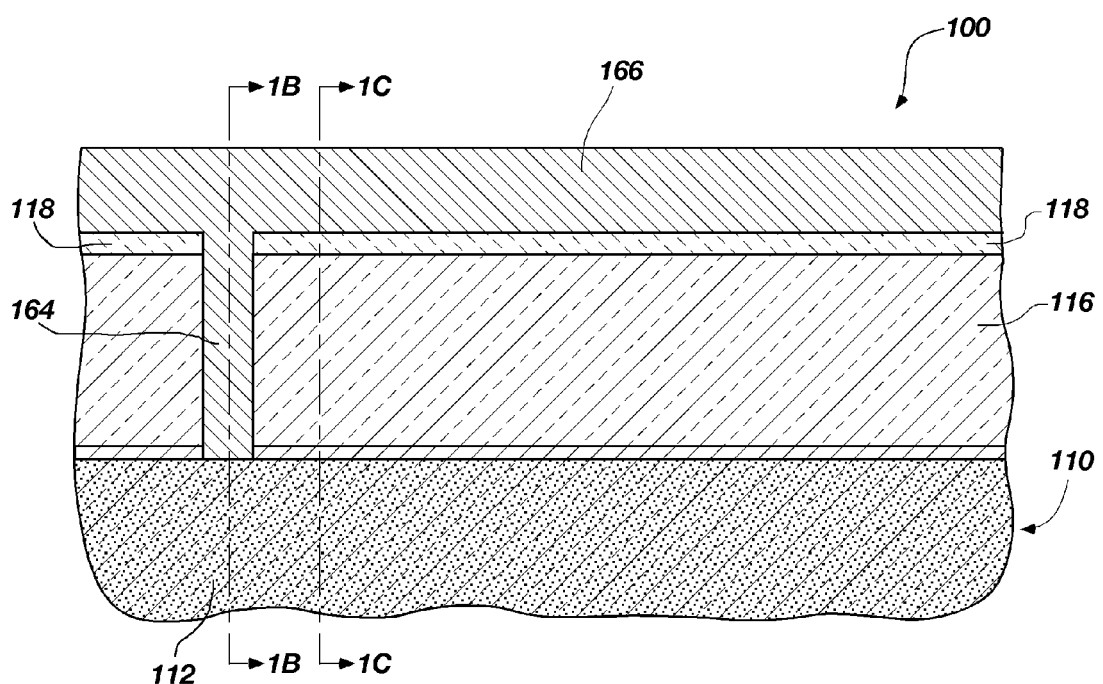

FIGS. 1A-1D illustrate a portion of a partially formed embodiment of a semiconductor device 100 of the present invention. In particular, FIG. 1A is partial top plan view of the semiconductor device 100. FIG. 1B is a partial cross-sectional view of the semiconductor device 100 taken along the section line 1B-1B shown in FIG. 1A. FIG. 1C is a partial cross-sectional side view of the semiconductor device 100 taken along the section line 1C-1C shown in FIG. 1A. As shown in FIG. 1A, FIG. 1B and FIG. 1C are taken in planes parallel to one another. Finally, FIG. 1D is a partial cross-sectional view of the semiconductor device 100 taken along the section line 1D-1D shown in FIG. 1A, and is taken in a plane oriented transverse to those of FIGS. 1B and 1C.

Referring to FIG. 1A, the semiconductor substrate 100 may comprise a number of laterally extending conductive traces or lines 166. The conductive lines 166 may have a tight pitch, and may comprise a conductive material such as, for example, copper, aluminum, or doped polysilicon. The semiconductor substrate 100 also may comprise a number of laterally extending conductive traces or lines 166A that do not have a tight pitch, only one of which is shown in the partial plan view of FIG. 1A.

Referring to FIG. 1B, the semiconductor device 100 may comprise a semiconductor substrate 110. The term "semiconductor substrate," as used herein, encompasses semiconductor dice, semiconductor wafers, partial wafers, and other bulk semiconductor substrates, such as silicon-on-insulator (SOI) substrates, silicon-on-glass (SOG) and silicon-on-sapphire (SOS) substrates. A number of laterally separated active regions or features 112 may be disposed on or in an active surface of the semiconductor substrate 110. The semiconductor substrate 110 may include a plurality of additional conductive lines (not shown), such as wordlines, associated with each of the active features 112. The schematically depicted active features 112 may comprise, for example, source, drain or gate regions of transistors, or they may comprise conductive traces or pads. In embodiments of the invention, an active feature 112 may comprise selectively doped and undoped portions of a semiconducting material layer such as, for example, silicon, silicon-germanium, gallium arsenide, indium phosphide, and III-V materials, or a conductive metal material such as copper or aluminum.

As will be appreciated by one of ordinary skill in the art, the semiconductor substrate 110 may contain numerous other features and topographical variations in addition to active features 112. By way of a non-limiting example of other features and topographical variations, shallow trench isolation regions 114 are depicted laterally isolating the region of the semiconductor substrate that includes the active features 112.

As further shown in FIG. 1B, the semiconductor device 100 may comprise a plurality of electrically conductive tight pitch conductive vias 164, each of which may extend in the vertical direction of FIG. 1B between an active feature 112 and a portion of a laterally extending tight pitch conductive line 166. In other words, each tight pitch conductive via 164 may provide electrical communication between an active feature 112 and a laterally extending conductive line 166. Furthermore, as discussed in further detail below, each tight pitch conductive via 164 may be integrally formed with its associated tight pitch laterally extending conductive line 166.

As best shown in FIG. 1D, the conductive vias 164 are confined in the lateral direction, and therefore, are present in the region of the semiconductor device 100 shown in FIG. 1B, but not in FIG. 1C. In other words, the conductive vias 164 do not extend laterally, as do the conductive lines 166. As also shown in FIG. 1D, the active features 112 also may extend a distance in a lateral direction parallel to one another along the semiconductor substrate 110.

In embodiments of the present invention, the active features 112, conductive vias 164, and conductive lines 166 may have a tight pitch, and may have widths of about 10 nm or less and may be spaced by a distance of about 50 nm or less (e.g., 10 nm). Thus, the pitch of the features 112, conductive vias 164, and conductive lines 166 may be about 60 nm or less (e.g., 20 nm). Of course, these elements may be wider or narrower than 10 nm and may be spaced more or less than 50 nm apart from one another without departing from the scope of the invention. In embodiments of the invention, active features 112, conductive vias 164, and conductive lines 166 may have a width of about 35 nm, or of about 25 nm.

An embodiment of a method of the present invention that may be used to form the semiconductor device 100 shown in FIGS. 1A-1D is described below.

Figure 2A:
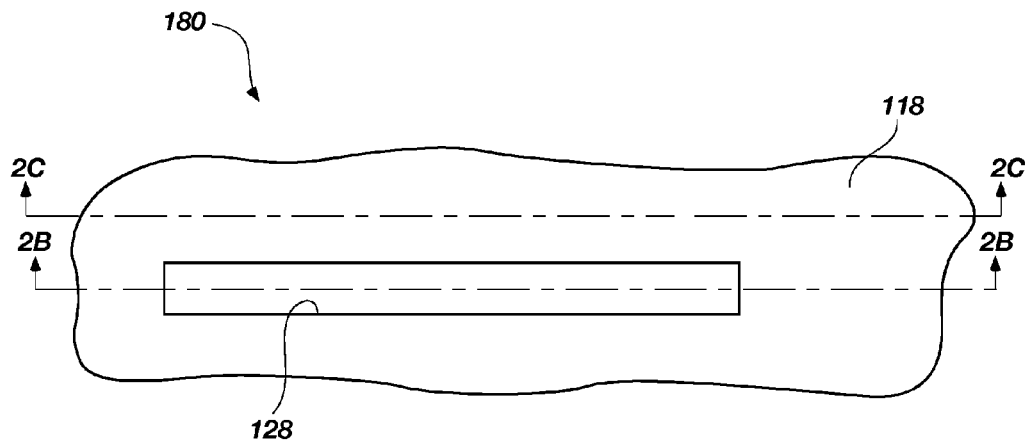
FIG. 2A is a partial top plan view of a workpiece that may be formed according to embodiments of methods of the present invention for forming semiconductor devices like that shown in FIGS. 1A-1D.
Figure 2B:
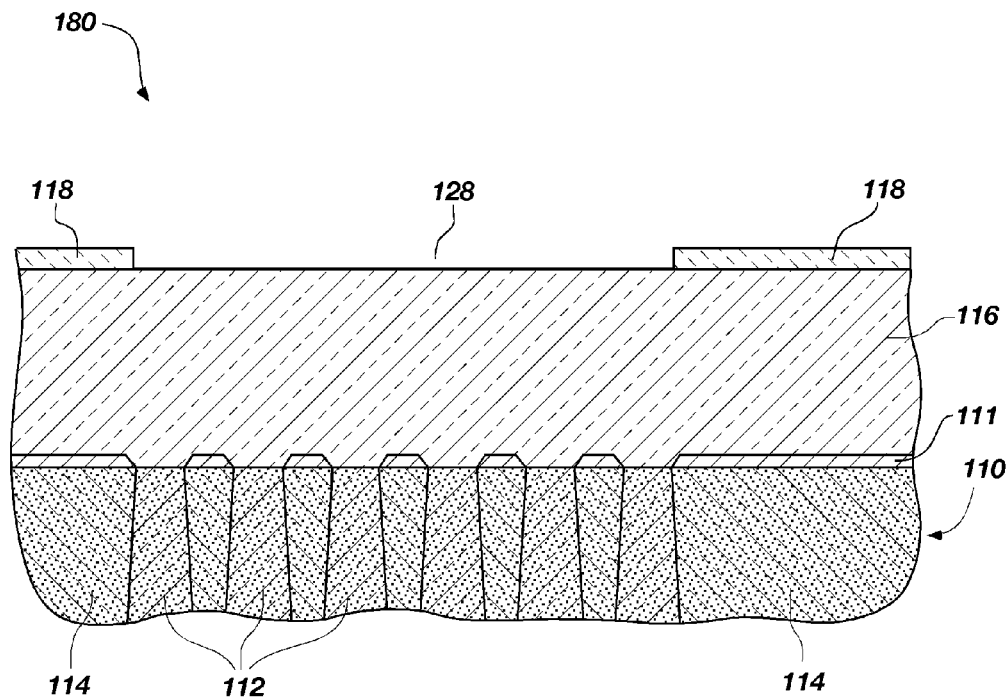
FIG. 2B is a partial cross-sectional side view of the workpiece shown in FIG. 2A taken along section line 2B-2B shown therein.
Figure 2C:
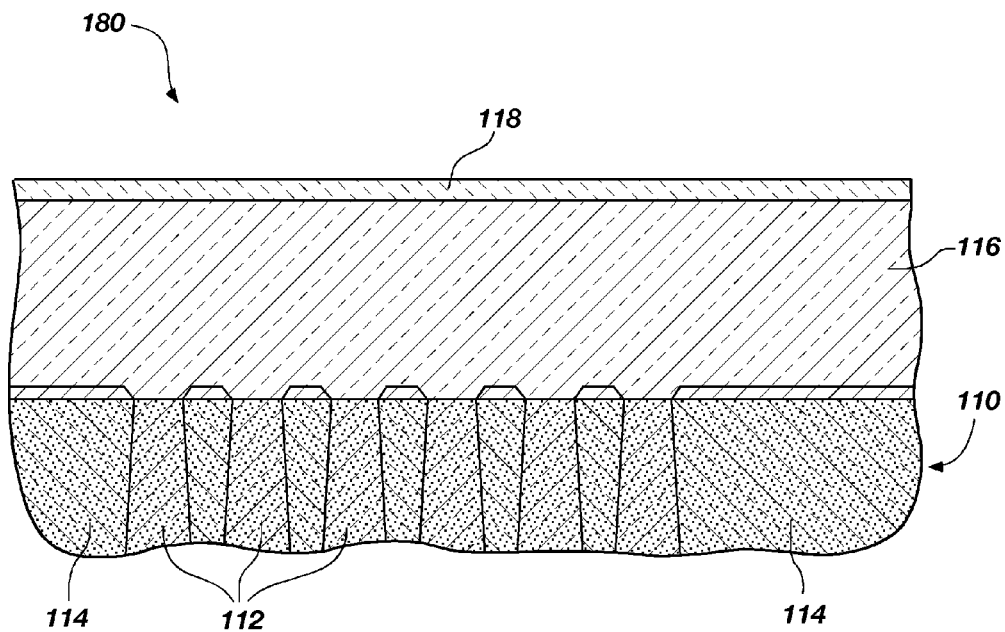
FIG. 2C is a partial cross-sectional side view of the workpiece shown in FIG. 2A taken along section line 2C-2C shown therein.

FIGS. 2A, 2B, and 2C illustrate a workpiece 180 comprising a partially formed semiconductor device 100. In particular, FIG. 2A is partial top plan view of the workpiece 180. FIG. 2B is a partial cross-sectional view of the workpiece 180 taken along the section line 2B-2B shown in FIG. 2A. FIG. 2C is a partial cross-sectional side view of the workpiece 180 taken along the section line 2C-2C shown in FIG. 2A. As shown in FIG. 2A, FIG. 2B and FIG. 2C are taken in planes parallel to one another.

Referring to FIG. 2B, the active features 112 may be formed in a semiconductor substrate 110 using methods known in the art. For example, a patterned mask layer may be formed over a surface of the semiconductor substrate 110, and the active features 112 may be formed in the surface of the semiconductor substrate 110 by doping the semiconductor substrate 110 with ions through the patterned mask layer to cause the active features 112 to comprise N-type and/or P-type doped semiconductor material regions.

As depicted in FIG. 2B, additional material layers may be formed over the semiconductor substrate 110 and any active features 112. For example, a field oxide layer 111 may be formed over the substrate 110, and the active features 112 may be exposed through apertures in the field oxide layer 111. Furthermore, a dielectric layer 116 may be formed over the active surface of the semiconductor substrate 110 (the surface of the semiconductor substrate 110 on or in which the active features 112 have been formed), and a hard mask layer 118 may be formed over a surface of the dielectric layer 116 opposite the semiconductor substrate 110.

By way of example and not limitation, the dielectric layer 116 may comprise what is commonly referred to in the art as an inter-level dielectric (ILD). The dielectric layer 116 may comprise any suitable electrical insulator including, as non-limiting examples, a high density plasma (HDP) oxide material, borophosphosilicate glass (BPSG), decomposed tetra-ethyl-ortho-silicate (TEOS), doped silicon dioxide ($SiO_2$), undoped silicon dioxide, spin-on glass, and low-k dielectrics, such as fluorinated glass. The dielectric layer 116 optionally may be planarized using a polishing or planarization process (e.g., mechanical polishing, chemical-mechanical polishing (CMP), etc.) to remove or shave off any portions of the dielectric layer 116 that protrude outwardly due to underlying topography before forming the hard mask 118 thereover.

As particular non-limiting examples, the dielectric layer 116 may comprise heavily doped BPSG or lightly doped BPSG. In order to maintain verticality of openings that will eventually be formed by etching through the dielectric layer 116 to form the conductive vias 164 (FIG. 1B) therein, it may be desirable that the dielectric layer 116 be formed of heavily doped and graded BPSG to stimulate faster etch rates near the bottom of the BPSG (the bottom relative to the orientation of the figures). It has been shown that the etch rate of BPSG may be at least partially related to the concentration of a dopant therein. Therefore, the concentration of the dopant in the BPSG may be configured to exhibit a gradient in a direction from the top of the BPSG to the bottom of the BPSG that will cause the etch rate to be slower at the top of the BPSG relative to the bottom of the BPSG. As the regions of the sidewalls of the BPSG within the openings near the top of the BPSG will be exposed to an etchant for a longer period of time relative to the regions near the bottom of the BPSG during an etching process, the verticality of the openings may be maintained as the openings are etched into the BPSG from the top of the BPSG toward the bottom thereof by causing the regions of the sidewalls of the BPSG within the openings near the bottom of the BPSG to exhibit a higher etch rate.

Hard mask 118, which may serve as an etch stop layer, may comprise any suitable mask material known to one of ordinary skill in the art. As non-limiting examples, the hard mask 118 may comprise silicon nitride ($Si_3N_4$), silicon carbide (SiC) (e.g., materials sold under the tradename BLOk by Applied Materials of Santa Clara, Calif.), silicon carbon nitride (SiCN), silicon-rich oxide, silicon oxynitride, aluminum oxide ($Al_2O_3$), or the like. Optionally, where process conditions permit, an antireflective coating (ARC) (not shown) also may be formed directly above the hard mask 118, directly below the hard mask 118, or both directly above and below the hard mask 118. Such antireflective coatings may comprise, for example, a dielectric antireflective coating (DARC), which may comprise a material such as, for example, silicon-rich silicon oxynitride, or a bottom antireflective coating (BARC), which may comprise a material such as, for example, that sold under the tradename DUV 112 by Brewer Science of Rolla, Mo.

As shown in FIGS. 2A and 2B, an aperture 128 may be formed through the hard mask 118 over a region on the dielectric layer 116 in which it is desired to form the conductive vias 164 (FIG. 1B). The aperture 128 may be formed in the hard mask 118 using, for example, optical photolithography, electron beam lithography, ion beam lithography, nanoimprint lithography, or any other suitable process. As shown in FIG. 2A, the aperture 128 may have a generally rectangular shape. In some embodiments, the aperture 128 may have dimensions (e.g., a length and a width) that may be defined by the resolution of conventional photolithographic processes. For example, in some embodiments, the aperture 128 may have at least one dimension (e.g., a width) that is approximately the minimum feature size obtainable using conventional photolithographic processes.

As one particular non-limiting example of a method that may be used to form the aperture 128 in the hard mask 118, a layer of photoresist material (not shown) may be formed over the surface of the hard mask 118 (and any BARC layer formed thereover). The photoresist material may comprise any suitable photoresist material known to one of ordinary skill in the art, including, but not limited to, a photoresist compatible with 13.7-nanometer (nm), 157-nm, 193-nm, 248-nm or 365-nm wavelength systems, 193-nm wavelength immersion systems or electron beam lithographic systems. Examples of suitable photoresist materials include, but are not limited to, argon fluoride (ArF) sensitive photoresist, e.g., photoresist suitable for use with an ArF light source, and krypton fluoride (KrF) sensitive photoresist, e.g., photoresist suitable for use with a KrF light source. ArF photoresists may be used with photolithography systems utilizing relatively short wavelength light, e.g., 193 nm. KrF photoresists may be used with longer wavelength photolithography systems, such as 248 nm systems.

Known processes (e.g., photolithographic exposure and development processes, etc.) may then be used to pattern the layer of photoresist material to form an aperture (not shown) therein to expose a portion of the hard mask 118 through the photoresist material. Once the aperture has been formed in the layer of photoresist material overlying the hard mask 118, the pattern in the photoresist layer may be transferred to the hard mask 118. In other words, the exposed region of hard mask 118 may be removed to create the aperture 128 in the hard mask 118, as depicted in FIGS. 2A and 2B. Removal of the exposed region of the hard mask 118 to form the aperture 128 may be effected by any suitable process, including, without limitation, wet or dry etch processes or otherwise, as known in the art. In embodiments of the present invention, removal may be effected by an anisotropic (or highly directional) etch. Dry etching may, in some embodiments, provide enhanced control of the critical dimensions. Examples of anisotropic etches include, but are not limited to, etches using a HBr/Cl plasma, $Cl_2$/HBr, or a fluorocarbon plasma having fluorocarbon plasma etch chemistries including, but not limited to, $CF_4$, $CFH_3$, $CF_2H_2$ and $CF_3H$. The etch may include a physical component and may also include a chemical component and may be, e.g., a reactive ion etch (RIE), such as a $Cl_2$/HBr etch. An etch may be performed, by way of non-limiting example, using an LAM TCP9400 etch chamber and flowing about 0-50 sccm $Cl_2$ and about 0-200 sccm HBr at about 7-60 mTorr pressure with about 300-1000 W top power and about 50-250 W bottom power. By way of a further non-limiting example, an AME 5000 etch chamber may also accomplish similar etches, although a different recipe and settings may be required.

The etching process used to remove the exposed portion of hard mask 118 may stop on, or not consume too much of, the dielectric layer 116. After forming the aperture 128 in the hard mask 118, any remaining portion of the layer of photoresist material may be removed from the substrate.

As will be better understood after a review of later portions of this specification, the hard mask 118 may function as an etch stop layer and may be used to prevent material of underlying layers, films, or structures from being undesirably removed during one or more subsequent etching processes. Therefore, the thickness of the hard mask 118 may be sufficiently thick to survive any subsequent etching processes, but not so thick as to create stepped topography therein.

Figure 3:
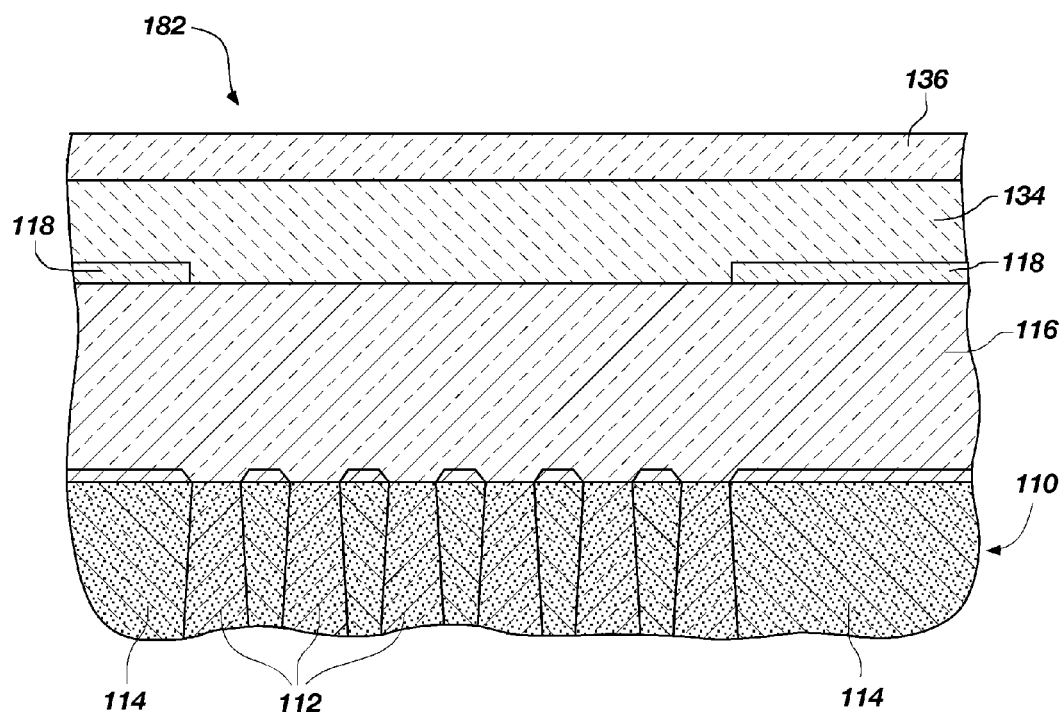
FIGS. 3-5 are partial cross-sectional side views of additional workpieces that may be formed from the workpiece shown in FIGS. 2A-2C, the cross-sectional view being taken in a plane comprising section line 2B-2B shown in FIG. 2A.

FIG. 3 is a partial cross-sectional view similar to that of FIG. 2B illustrating an additional workpiece 182 that may be formed from the workpiece 180 (FIGS. 2A-2C) by forming (e.g., depositing) additional material layers over the first hard mask 118, to fill second aperture 128 and further fabricate the semiconductor device 100 (FIGS. 1A-1C). Additional layers may include, for example, another dielectric layer 134 and another hard mask 136. By way of example and not limitation, the another dielectric layer 134 may be from about fifty nanometers (50 nm) to about two hundred nanometers (200 nm) in thickness, depending on the desired final height or thickness of the conductive lines 166.

The dielectric layer 134 may be of similar or different composition to that of dielectric layer 116. As a non-limiting example, the insulating dielectric layer 134 may comprise TEOS having a dielectric constant (K) of about 3.9. If copper metallization is to be employed as a conductor or interconnect in the semiconductor device 100 (FIGS. 1A-1C), a fluorinated glass, having a dielectric constant (K) of about 2.6 to 2.3, may be employed. Other suitable materials may also be employed. The hard mask 136 may comprise, for example, a transparent carbon (TC) material.

Figure 4:
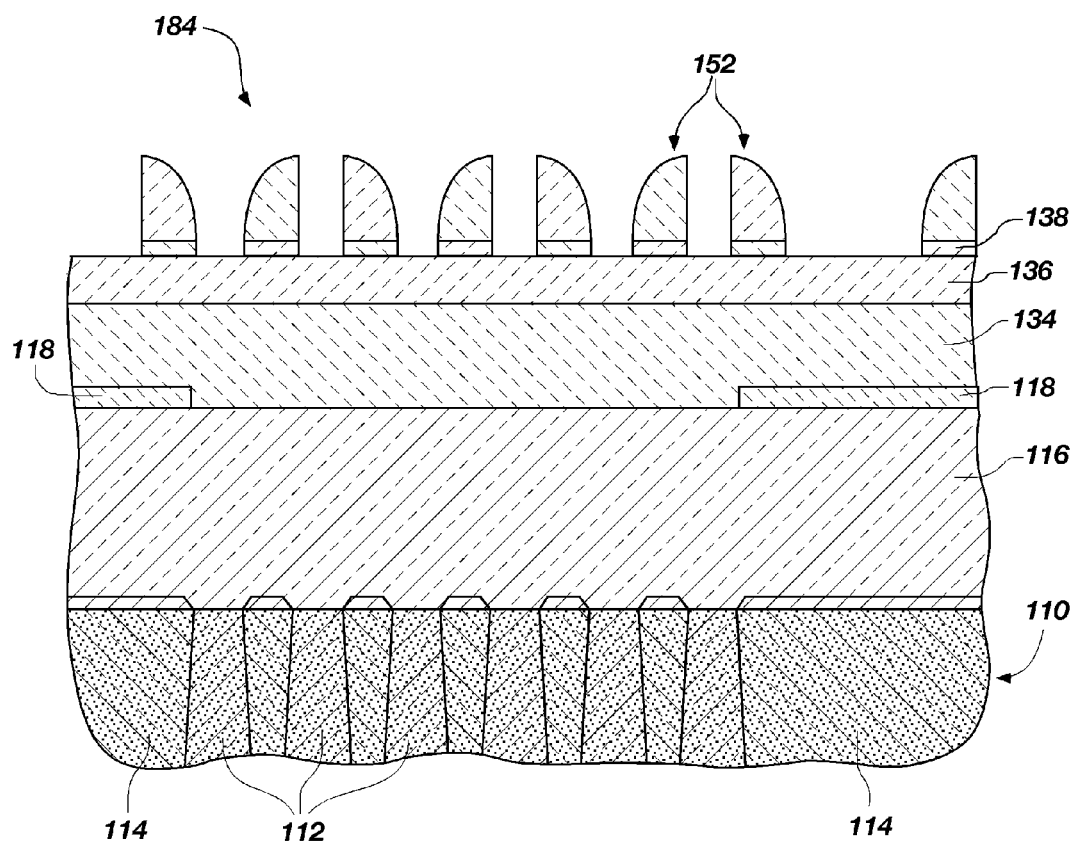

Referring to FIG. 4, tight pitch spacers 152 may be formed over the hard mask 136. The tight pitch spacers 152 may be formed using methods known in the art, such as, for example, those disclosed in U.S. Pat. No. 7,115,525 to Abatchev et al. and U.S. patent application Ser. No. 11/511,541, filed Aug. 29, 2006, and entitled "Semiconductor Devices Including Fine Pitch Arrays with Staggered Contacts and Methods for Designing and Fabricating the Same," the entire disclosure of each of which is incorporated herein by this reference. Optionally, an ARC layer 138 may be provided between the spacers 152 and the hard mask 136, as shown in FIG. 4. The ARC layer 138 may comprise a DARC layer, and may comprise any suitable DARC material known to one of ordinary skill in the art including, but not limited to, a silicon-rich oxynitride, or any other DARC coating.

Another non-limiting example of a process that may be used to form the tight pitch spacers 152 comprises a low-temperature atomic layer deposition (ALD) process performed in one or more cycles to achieve a desired spacer material thickness. Briefly summarized, a layer of photoresist material is deposited over the hard mask 136 (and the optional ARC layer 138) and patterned using standard photolithography processes to form a plurality of openings in the layer of photoresist material that defines a plurality of lines therebetween each having a width of about sixty nanometers (60 nm) or more. After forming the alternating lines and openings in the layer of photoresist material, the width of the lines may be reduced (and the width of the openings increased) using a so-called "resist trimming" or "carbon trimming" process. Such processes are known in the art. A relatively thin layer of spacer material may be deposited over the patterned layer of photoresist material. For example, a low temperature atomic layer deposition (ALD) process may be used to deposit spacer material over the photoresist material. The spacer material may be blanket deposited in a manner such that it conforms to the features of any exposed surfaces of the workpiece including the sidewalls of the lines formed from the photoresist material. As a non-limiting example, a thin layer of silicon dioxide ($SiO_2$) spacer material may be deposited in an ALD chamber at a temperature of between about 75° C. and about 100° C. in an atmosphere comprising hexachlorodisilane (HSD), $H_2O$, and pyridine ($C_5H_5N$). The pyridine may serve as a catalyst to enable film growth at the lower temperatures. Each ALD cycle may comprise a pulse from about 2 seconds to about 5 seconds of a mixture of HSD and pyridine. This may be followed by an argon pulse lasting from about 5 seconds to about 10 seconds. The surface may then be pulsed from about 2 seconds to about 5 seconds with a mixture of $H_2O$ and pyridine, and may be followed by another Argon pulse lasting from about 5 seconds to about 10 seconds. The resulting deposition rate may be about 2.5 Å/cycle. The above process may result in a substantially stoichiometric $SiO_2$ film with low bulk contamination, which may include C (<2 at %), H (<22 at %), N (<1 at %), and/or Cl (<1 at %).

In additional embodiments, the spacer material may be formed by any suitable process that does not destroy the underlying photoresist material, including, but not limited to, plasma-enhanced or assisted chemical vapor deposition (PECVD) or low-temperature and conformal deposition techniques.

After depositing the layer of spacer material, a so-called "spacer etch" may be conducted to form the tight pitch spacers 152 shown in FIG. 4 from the layer of spacer material. As known to those of ordinary skill in the art, a spacer etch is a highly anisotropic etching process. The spacer etch process may include a physical component, and may also include a chemical component. The spacer etch process may be, for example, a reactive ion etching (RIE) process. As one particular non-limiting example, the spacer etch may be performed using, for example, carbon tetrafluoride ($CF_4$) and argon (Ar) plasma for an oxide spacer material. After a spacer etch is performed, it may leave behind a pattern of elongate spacers having an effectively reduced pitch. The ARC layer 138 or the hard mask 136 may act as a partial etch stop layer during the spacer etch process. The spacer etch process removes the relatively vertically thin portions of the layer of spacer material, but leaves behind vertically thick portions of the layer of spacer material. In general, spacer material deposited on laterally extending surfaces of the workpiece 184 is removed during the spacer etch, while at least a portion of the spacer material deposited on vertically extending surfaces (such as, for example, the sidewalls of the lines previously formed from the photoresist material) remains on the workpiece 184. The result as illustrated in FIG. 4 includes individual tight pitch spacers 152.

Any remaining portions of the photoresist material and exposed portions of the ARC layer 138 may be removed by suitable processes, leaving behind the spacers 152. The processes that are used depend, of course, upon the material or materials from which photoresist and the ARC layer 138 are formed.

Other methods for forming tight pitch features, like the tight pitch spacers 152 shown in FIG. 4, are known in the art and may be employed in embodiments of the present invention. By way of example and not limitation, methods such as those disclosed in United States Patent Publication No. 2007/0161251 A1, filed Mar. 1, 2007, and entitled "Pitch Reduced Patterns Relative to Photolithography Features," the entire disclosure of which is incorporated herein by this reference, may be used to form tight pitch spacers 152.

Figure 5:
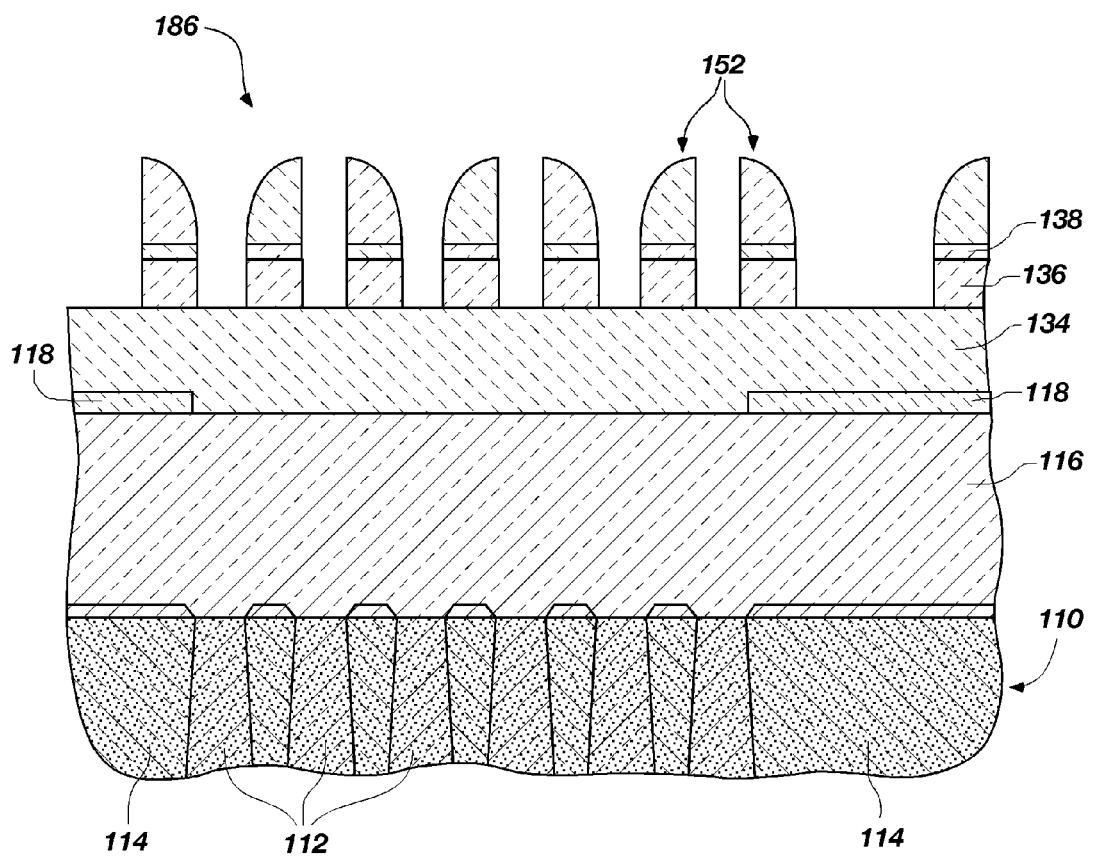

Referring to FIG. 5, an etching process (e.g., an anisotropic dry etching process) may be used to transfer the pattern of the spacers 152 to the hard mask 136 and form the workpiece 186 shown in FIG. 5. In other words, the hard mask 136 may be etched using the spacers 152 as a mask.

Figure 6A:
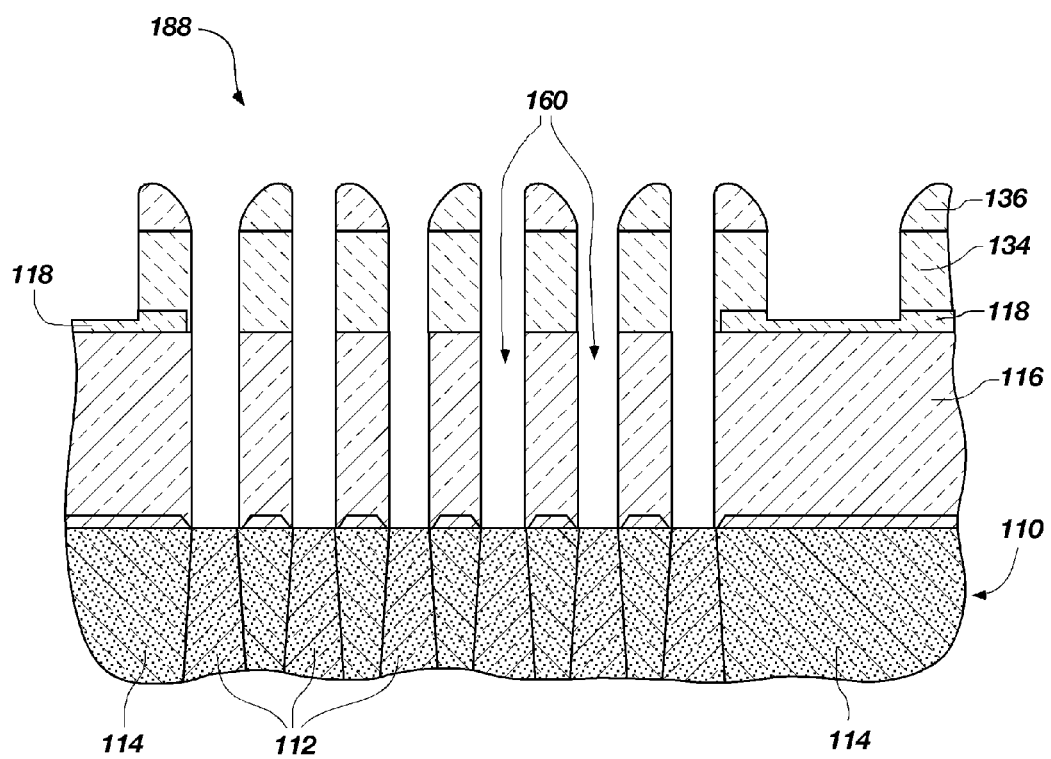
FIG. 6A is a partial cross-sectional side view of an additional workpiece that may be formed from the workpiece shown in FIGS. 2A-2C, the cross-sectional view being taken in a plane comprising section line 2B-2B shown in FIG. 2A.
Figure 6B:
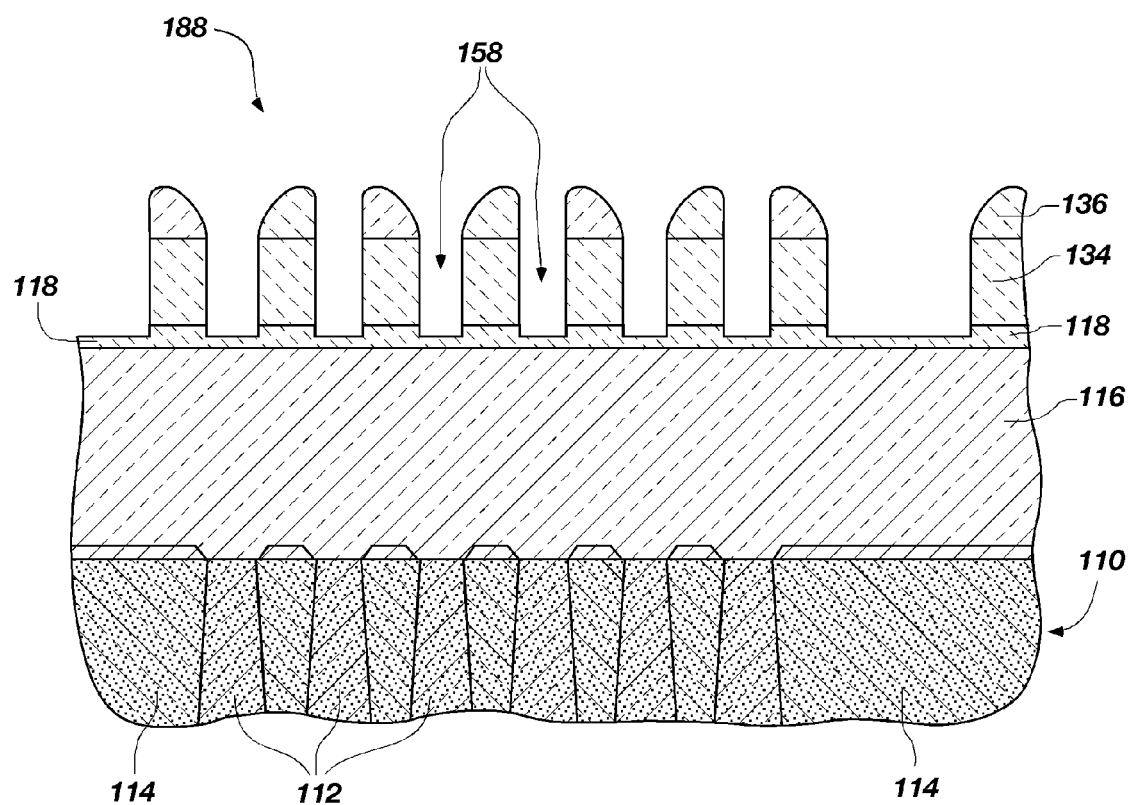
FIG. 6B is a partial cross-sectional side view of the additional workpiece shown in FIG. 6A taken in a plane comprising section line 2C-2C shown in FIG. 2A.

Referring to FIGS. 6A and 6B, another etching process, such as a high density plasma etch, may then be performed using the spacers 152 (FIG. 5), hard mask 136, and the underlying hard mask 118 as mask structures to form tightly pitched trenches 158 and self-aligned contact holes 160, expose the underlying active features 112, and form the workpiece 188 shown in FIGS. 6A and 6B. FIG. 6A is a partial cross-sectional view of the workpiece 188 taken in the plane of section line 2B-2B shown in FIG. 2A, and FIG. 6B is a partial cross-sectional view of the workpiece 188 taken in the plane of section line 2C-2C shown in FIG. 2A.

Removal of material from the dielectric layer 134 and the dielectric layer 116 may be effected with a suitable etchant or combination of etchants. The removal process may also substantially simultaneously remove the remaining material of the spacers 152 and the underlying ARC layer 138). For example, a plasma formed from a mixture of $C_4F_8$, $C_4F_6$, and $O_2$ may be used to remove material from dielectric layer 134 and dielectric layer 116 if dielectric layer 134 and dielectric layer 116 comprise silicon dioxide, as such a plasma removes silicon dioxide with selectivity over silicon nitride, from which one or both of the hard mask 118 and the hard mask 136 may be formed.

The etch may be an oxide trench and self-aligned contact etch. In some embodiments, the etch may be a dry etch. The etch may be straight in profile so that contact holes 160 created in communication with features 112 are not pinched, e.g., at the bottom, middle, and/or top. The etch may have a high selectivity for the materials of dielectric layers 116 and 134 over the material of hard mask 118, such that a relatively thin first hard mask 118 is capable of stopping the etch. An anisotropic dry etch, used in conjunction with dielectric layer 116 of heavily doped and graded BPSG, may be used to form contact holes 160 with high sidewall verticality, as previously described herein.

The lateral dimension across the bottom end of each contact hole 160 may be large enough (e.g., about 30 nm) to minimize contact resistance between a conductive via 164 (FIG. 1B) subsequently formed within each contact hole 160 and its feature 112. Further, the alignment of contact holes 160 to features 112 is significant. For a thirty-five-nanometer (35-nm) feature size, the alignment tolerance may be less than about twelve nanometers (12 nm), while for a twenty-five-nanometer (25-nm) feature size, it may be less than about eight nanometers (8 nm).

Any remaining portions of the spacers 152, the ARC layer 138, and/or the hard mask 136 may be removed and the workpiece 188 may be cleaned (e.g., by suitable stripping and cleaning processes) prior to filling the trenches 158 and the contact holes 160 with conductive material to form the conductive lines 166 and the conductive vias 164.

After forming the tight pitch trenches 158 and corresponding tight pitch contact holes 160 in a self-aligned manner, one or more conductive materials may be introduced into the trenches 158 and contact holes 160 to form the conductive lines 166 and the conductive vias 164, respectively, of the at least partially formed semiconductor device 100 shown in FIGS. 1A-1D. By way of example and not limitation, one or more conductive materials may be provided within the trenches 158 and the contact holes 160 by chemical vapor deposition (CVD), physical vapor deposition (PVD), electroplating, electroless plating, or by a combination of such processes.

In this manner, the tight pitch conductive vias 164 and tight pitch conductive lines 166 (FIGS. 1A-1D) are formed substantially concurrently in a self-aligned manner, and there is no need for alignment tolerance. Furthermore, the tight pitch conductive vias 164 and tight pitch conductive lines 166 are integrally formed with one another during fabrication. As a result, there is no identifiable boundary between each of the corresponding conductive vias 164 and conductive lines 166.

As one non-limiting example, an initial film or seed layer (not shown) of conductive material may be formed over the exposed surfaces within each trench 158 and contact hole 160, including over surfaces of the active features 112 and the hard mask 118, using an electroless plating process. Thereafter, a conductive material may be electroplated to or over the seed layer to fill each trench 158 and contact hole 160 with the conductive material.

By way of non-limiting example only, an initial film may comprise a layer of seed material (e.g., titanium nitride (TiN), etc.), which may enhance or facilitate the adhesion of a bulk conductive material comprising tungsten to the surfaces within the contact holes 160 and the trenches 158. Other conductive materials, such as copper, aluminum and nickel are also suitable for use as conductive materials within the contact holes 160 and the trenches 158.

In other embodiments, a seed layer may be formed from a material (e.g., tungsten (W), tungsten nitride (WN), a metal silicide, tantalum nitride (TaN) (for use with copper (Cu), etc.) that acts as both an adhesion layer and a barrier layer (e.g., to prevent diffusion or interdiffusion, to reduce contact resistance, etc.) between material at the surfaces of trenches 158 and contact holes 160 and the bulk conductive material (e.g., aluminum (Al), copper (Cu), etc.). In view of the extremely small dimensions of the tight pitch trenches 158 and the tight pitch contact holes 160, the seed layer may be extremely thin (e.g., about 5 nm). Known processes, including, but not limited to, pulsed chemical vapor deposition (CVD) and atomic layer deposition (ALD) techniques may be used to form the seed layer as well as the bulk conductive material. As the lateral dimensions of trenches 158 and contact holes 160 are reduced, the use of ALD techniques may be required.

Optionally, adjacent conductive lines 166 may be physically and electrically separated from one another by removing any excess conductive material from the workpiece. Without limiting the scope of the present invention, such removal may be effected by way of a polishing or planarization process (e.g., mechanical polishing, chemical-mechanical polishing (CMP), etc.) to remove the conductive material with at least some selectivity over (i.e., at a faster rate than) the material of dielectric layer 134. Alternatively, a timed, selective etch process may be employed to remove excess conductive material.

Processes and structures according to embodiments of the present invention may facilitate the use of lithography apparatuses to fabricate semiconductor devices in a manner not possible with conventional techniques. For example, lithography apparatuses have alignment tolerance limits that are typically a fraction (e.g., one-third) of a minimum feature size with which they may be employed. By use of the embodiments of the present invention, however, lithography apparatuses may be employed in fabricating features that will align with features of much smaller dimensions and alignment tolerances, effectively increasing the alignment tolerances of lithography apparatus.

CONCLUSION

In embodiments of the present invention, a semiconductor structure includes a tight pitch conductive line and contact aligned with an active area feature. The line and contact may be formed at the same time from the same material so that they comprise a single integrally formed structure. By creating the trench for the conductive line and the contact hole at the same time using a combination of superimposed mask structures, a tight pitch and alignment therebetween may be enabled. Fabrication acts and, thus, time and materials are saved. Further, as the contact hole is simultaneously formed with the trench for the conductive line, any potential for misalignment of the line and its associated contact is minimized in at least one direction. As used herein, the term "semiconductor structure" includes wafers and other bulk semiconductor substrates, partial wafers, groups of dice, and singulated dice. Such semiconductor structures comprise both packaged and unpackaged integrated circuits, as well as in-process semiconductor structures.

Embodiments of the present invention include methods for fabricating simultaneously formed tight pitch contact holes and line trenches in or on semiconductor structures. The tight pitch contact holes and line trenches may be formed using various methods including, for example, pitch doubling (or pitch multiplication) processes, double patterning, double exposure, maskless photolithography, and advanced fine line lithography. Such methods may employ a methodology, in which trenches and associated discrete, laterally isolated apertures are formed at a tight pitch to extend through two or more different fabrication levels, or elevations, of a semiconductor structure. The trenches and apertures are then filled with conductive material. In some embodiments of the methods, a mask is provided with one or more apertures at locations where the contact plugs are to be formed, trenches are formed to extend thereover and communicating contact holes are created therethrough, and the conductive lines and contact plugs are subsequently simultaneously formed. When such techniques are employed, it removes the necessity of additional acts to form and align the conductive lines with the contact plugs.

Embodiments of the invention include intermediate structures that are formed during the performance of such methods. Embodiments of the invention may include, but are not limited to, intermediate semiconductor structures, which may include material layers that serve multiple functions. In a non-limiting example, a single material layer may serve as an etch stop, a hard mask, and a polish stop at different stages of a fabrication process.

Although the foregoing description contains many specifics, these should not be construed as limiting the scope of the present invention, but merely as providing illustrations of some embodiments. Other embodiments of the invention may be devised which are encompassed within the scope of the present invention. Features and elements from different embodiments may be employed in combination. The scope of the invention is, therefore, indicated and limited only by the appended claims and their legal equivalents, rather than by the foregoing description. All additions, deletions and modifications to embodiments of the invention as disclosed herein which fall within the meaning and scope of the claims are to be embraced thereby.

What is claimed is:
1. A semiconductor structure comprising:
 a plurality of tight pitch conductive lines formed over a mask; and a plurality of tight pitch conductive contacts extending through a common aperture formed in the mask, wherein each tight pitch conductive contact of the plurality of tight pitch conductive contacts is operatively connected to a corresponding tight pitch conductive line of the plurality of tight pitch conductive lines.

2. The semiconductor structure of claim 1, wherein the mask comprises a material at least partially resistant to an etching process.

3. The semiconductor structure of claim 2, wherein the mask material is chosen from the group consisting of silicon nitride, silicon carbide, silicon carbide nitride, silicon-rich oxide, silicon oxynitride, and aluminum oxide.

4. The semiconductor structure of claim 1, further comprising an antireflective coating adjacent the mask.

5. The semiconductor structure of claim 1, wherein each tight pitch conductive contact of the plurality of tight pitch conductive contacts is integrally formed with the corresponding tight pitch conductive line of the plurality of tight pitch conductive lines.

6. The semiconductor structure of claim 1, wherein the plurality of tight pitch conductive contacts comprises a plurality of conductive vias.

7. The semiconductor structure of claim 6, wherein each conductive via of the plurality of conductive vias extends from one tight pitch conductive line of the plurality of tight pitch conductive lines to a corresponding tight pitch active area on a semiconductor substrate.

8. The semiconductor structure of claim 7, wherein each corresponding tight pitch active area comprises at least a portion of a feature selected from the group consisting of a source, a drain, a gate, a conductive pad and a conductive trace.

9. The semiconductor structure of claim 1, wherein the conductive lines of the plurality of tight pitch conductive lines and the conductive contacts of the plurality of tight pitch conductive contacts each have a width of less than about 50 nm.

10. The semiconductor structure of claim 1, wherein the conductive lines of the plurality of tight pitch conductive lines extend in a direction substantially parallel to one another.

11. The semiconductor structure of claim 1, wherein each tight pitch contact of the plurality of tight pitch contacts extends in a direction generally perpendicular to each tight pitch conductive line of the plurality of tight pitch conductive lines.

12. A semiconductor structure comprising:
a plurality of tight pitch conductive contacts; and
a mask, wherein each tight pitch conductive contact of the plurality of tight pitch conductive contacts extends through a common aperture in the mask.

13. The semiconductor structure of claim 12, wherein each tight pitch contact of the plurality of tight pitch contacts is operatively connected to a corresponding tight pitch active area of a plurality of tight pitch active areas in a semiconductor substrate.

14. The semiconductor structure of claim 13, wherein at least one of the plurality of tight pitch active areas comprises at least a portion of a feature selected from the group consisting of a source, a drain, a gate, a conductive pad and a conductive trace.

15. The semiconductor structure of claim 13, further comprising a plurality of tight pitch conductive lines extending over the semiconductor substrate, wherein each tight pitch conductive contact of the plurality of tight pitch conductive contacts extends from a corresponding tight pitch conductive line of the plurality of tight pitch conductive lines.

16. The semiconductor structure of claim 15, wherein each tight pitch conductive contact of the plurality of tight pitch conductive contacts extends in a direction generally perpendicular to each tight pitch conductive line of the plurality of tight pitch conductive lines.

17. The semiconductor structure of claim 15, wherein each tight pitch conductive line of the plurality of tight pitch conductive lines is integrally formed with a corresponding tight pitch conductive contact of the plurality of tight pitch conductive contacts.

18. The semiconductor structure of claim 13, wherein the common aperture in the mask layer is elongated and extends in a lateral direction over the semiconductor substrate in a direction generally perpendicular to the plurality of tight pitch conductive lines.

19. The semiconductor structure of claim 13, wherein the conductive lines of the plurality of tight pitch conductive lines and the conductive contacts of the plurality of tight pitch conductive contacts each have a width of equal to or less than about 35 nm.

20. The semiconductor structure of claim 19, wherein the conductive contacts of the plurality of tight pitch conductive contacts each have a width of at least about 30 nm adjacent each tight pitch active area of the plurality of tight pitch active areas.

* * * * *